United States Patent [19]
Ackerman et al.

[11] Patent Number: 5,285,468
[45] Date of Patent: Feb. 8, 1994

[54] ANALOG OPTICAL FIBER COMMUNICATION SYSTEM, AND LASER ADAPTED FOR USE IN SUCH A SYSTEM

[75] Inventors: David A. Ackerman, Hopewell; Paul M. Nitzsche, Plainfield, both of N.J.; Paul W. Smith, Reading, Pa.

[73] Assignee: AT&T Bell Laboratories, Murray Hill, N.J.

[21] Appl. No.: 916,282

[22] Filed: Jul. 17, 1992

[51] Int. Cl.$^5$ ............................................... H01S 3/08
[52] U.S. Cl. ........................................ 372/96; 372/49
[58] Field of Search ................................. 372/49, 96

[56] References Cited

U.S. PATENT DOCUMENTS

| | | | |
|---|---|---|---|
| 4,749,255 | 6/1988 | Chakrabarti et al. | 350/164 |
| 4,815,089 | 3/1989 | Miyauchi et al. | 372/49 |
| 4,993,036 | 2/1991 | Ikeda et al. | 372/49 |
| 5,111,475 | 5/1992 | Ackerman et al. | 372/96 |

FOREIGN PATENT DOCUMENTS 59-92588(A) 5/1984 Japan .

OTHER PUBLICATIONS

"Growth and Characterization of High Yield, Reliable, High-Power, High-Speed, InP/GaAsP Capped Mesa Buried Heterostructure Distributed Feedback (CMBH-DFB) Lasers", by J. L. Zilko et al, *IEEE Journal of Quantum Electronics*, vol. 25, No. 10, Oct. 1989, pp. 2091–2095.

"High-Fidelity Lightwave Tramsmission of Multiple AM-VSB NTSC Signals", by J. Lipson et al, *IEEE Transactions on Microwave Theory and Techniques*, vol. 38, No. 5, May 1990, pp. 483–493.

*Primary Examiner*—James W. Davie
*Attorney, Agent, or Firm*—Eugen E. Pacher

[57] ABSTRACT

We have discovered that the yield of DFB lasers suitable, e.g., for use in AM CATV systems can be substantially increased if the lasers have a back facet with a higher reflectivity (>80%, preferably >90%) HR coating thereon than is conventional (e.g., ~65%). Exemplary currently preferred embodiments of the invention comprise a three-pair stack of $\lambda/4$ yttrium-stablized zirconia/Si having about 95% reflectivity.

8 Claims, 2 Drawing Sheets

ANALOG OPTICAL FIBER COMMUNICATION SYSTEM, AND LASER ADAPTED FOR USE IN SUCH A SYSTEM

FIELD OF THE INVENTION

This invention pertains to optical multichannel analog communications systems, and to semiconductor lasers adapted for use in such systems.

BACKGROUND OF THE INVENTION

The concept of transmitting several television channels through optical fiber using analog intensity modulation of the output of a semiconductor laser diode has recently been receiving considerable attention. As proposed in the prior art, this would involve transmission of multi-channel amplitude modulated-vestigial side band (AM-VSB) signals, as used in present day cable television (CATV) systems, in an optical fiber transmission medium. Such an arrangement would be useful in a CATV trunk system or in a fiber-to-the-home network. Optical fiber transmission systems that use frequency division multiplexing overcome compatibility problems and have advantages such as simplicity of design, reduced bandwidth requirements for lightwave components, and much lower costs, as compared with optical time division multiplex (TDM) systems. For a discussion of such systems see, for instance, U.S. Pat. No. 5,111,475, incorporated herein by reference.

In order to achieve acceptable system performance, the lasers used in such a system must have a light output whose intensity is a very nearly linear function of the laser drive current under large-signal modulation. Strict limitations on laser nonlinearity are required because of the wide dynamic range of the National Television Systems Committee (NTSC) standard video format. Exemplarily, in the NTSC standard video format, the ratio of the magnitude of the carrier to the magnitude of the total third order intermodulation distortion products at the carrier frequency must be less than −65 dBc. Similarly, the peak second-order distortion, i.e., the sum of several tens of two-tone products (or the ratio of the carrier to the largest composite second-order peak), must be less than −60 dBc. To obtain such high signal quality in view of the large number of distortion products, the transmitting laser light-versus-current characteristic must be extremely linear. However, lasers that meet these linearity criteria are difficult to manufacture and typically have low manufacturing yield. Lasers for multichannel analog systems typically are distributed feedback (DFB) lasers, i.e., lasers that comprise a "diffraction grating".

The above cited '475 patent discloses some design features which can increase the yield of acceptable DFB lasers. However, although lasers according to the '475 patent can be manufactured at higher yield than some prior lasers, the yield is typically still substantially below 100%. This of course is undesirable since it results in relatively high unit cost of acceptable lasers. A laser design that can result in increased yield of low distortion lasers thus would have substantial economic significance. This application discloses a distributed feedback laser having a novel design feature that can result in increased yield of lasers acceptable for use in multichannel analog communication systems.

THE INVENTION

Figure 1:
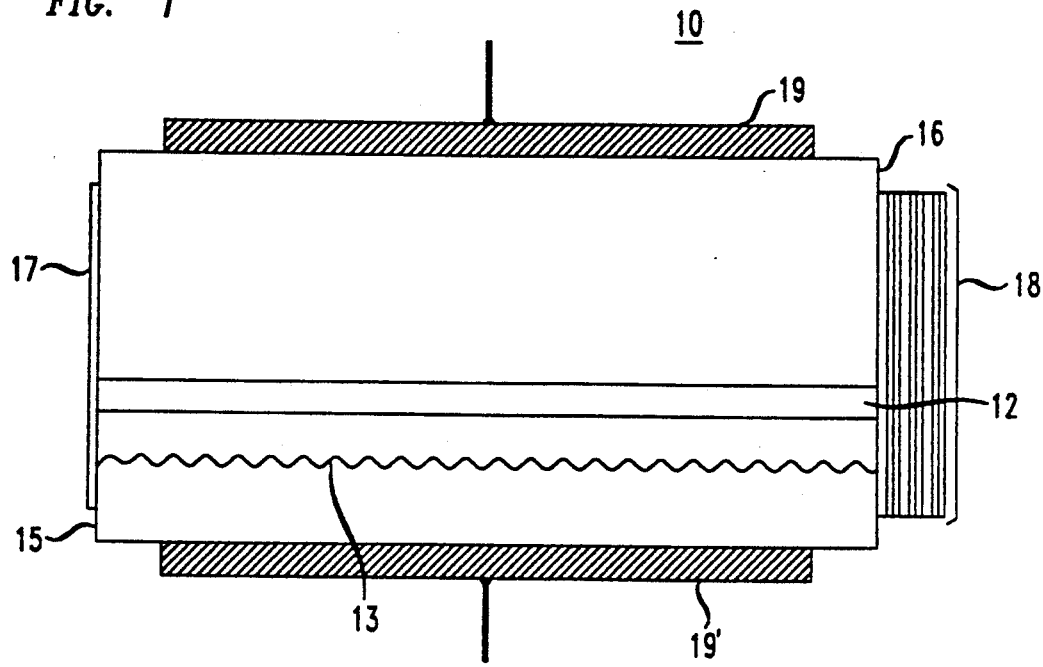
FIG. 1 schematically depicts an exemplary embodiment of a DFB laser according to the invention.

We have discovered a relatively simple design modification which can result in substantially improved yield of DFB lasers with highly linear output and/or which can result in more uniform back facet power.

Prior art DFB lasers having an antireflection (AR) coated front facet and a high reflection (HR) coated back facet are known. See, for instance, the '475 patent; J. L. Zilko et al., *IEEE Journal of Quantum Electronics*, Vol. 25(10), pp. 2091–2095 (incorporated herein by reference); and Japanese Patent Document No. 59-92588(A), May 28, 1984. However, the HR coating of prior art lasers typically consists of a single layer pair [comprising, for instance, a layer of yttrium-stablized zirconia (YSZ) followed by a layer of Si], and has a reflectivity that typically is less than 80%, e.g., about 65%. See, for instance, Example 1 of the '475 patent. Regarding a technique for depositing YSZ see, for instance, U.S. Pat. No. 4,749,255, incorporated herein by reference. The above-cited Japanese document discloses a HR coating (81) whose reflectivity allegedly is close to 100%. The coating appears to be a single layer, and the document does not disclose how such a high reflectivity is obtained with a single layer coating.

We have made the unexpected discovery that replacement of the single pair prior art (relatively low reflectivity) HR coating with a (typically at least two pairs, frequently three or even more pairs, but not excluding the possibility of a single pair of appropriately chosen layers) coating whose reflectivity is at least 80%, preferably greater than 90%, can result in performance improvements which can translate into increased manufacturing yield and/or in lower variability of back facet power over a batch of lasers.

Thus, our invention is embodied in an article that comprises a DFB semiconductor laser. The laser comprises a semiconductor body that forms a radiation cavity that is defined by a front facet and a back facet. Associated with each facet is a reflectivity at a given wavelength λ, the emission wavelength of the laser. The front facet comprises an AR coating of relatively low (e.g., less than about 1%) reflectivity and the back facet comprises a HR coating of relatively high reflectivity. The laser further comprises a diffraction grating that is associated with the radiation cavity, and still further comprises contact means that facilitate flowing an electrical current through the semiconductor body. Significantly, the HR coating preferably comprises a multilayer stack of interleaved layers, the stack comprising at least two pairs of layers, each layer pair consisting of a layer of a first material (e.g., YSZ) and a layer of second material (e.g., Si), the stack selected such that the reflectivity (at the wavelength λ) that is associated with the back facet is at least 80%. The layer thicknesses typically are chosen such that the optical thickness (i.e., the layer thickness multiplied by the refractive index of the material) of each layer is $\lambda/4$. It will be understood that the first and second materials differ in their refractive index. In another embodiment the laser comprises a HR coating (with reflectivity of at least 80%) that comprises a single pair of appropriately chosen layers. Single pair embodiments of the invention typically will comprise a first layer that has a refractive index lower than that of YSZ.

FIG. 1 schematically depicts an exemplary DFB laser 10 according to the invention. The semiconductor body of the laser comprises active region 12 and grating 13. The front facet 15 is (completely or partially) covered with conventional AR coating 17, and back facet 16 is (completely or partially) covered with multilayer HR coating 18 according to the invention. The laser also comprises conventional contacts 19 and 19'. As depicted, the HR coating comprises 3 pairs of layers.

Those skilled in the art will appreciate that the invention can be practiced with any DFB laser, including those disclosed in the '475 patent. For details on growth and characterization of InP-based DFB lasers see, for instance, J. L. Zilko et al., (op. cit.).

A standard figure of merit of lasers for multichannel analog CATV applications is the so-called composite second order (CSO) distortion. We have made conventional measurements on an exemplary batch of 49 DFB lasers, first on lasers with a conventional (65% reflectivity) single layer pair back facet coating. After completion of the first set of measurements, two more layer pairs were deposited on the back facets of the same lasers, resulting in lasers according to the invention, with approximately 95% reflectivity. The measurements were conventional. See, for instance, J. Lipson et al., *IEEE Transactions on Microwave Theory and Techniques*, Vol. 38(5), pp. 483–493.

Figure 2:
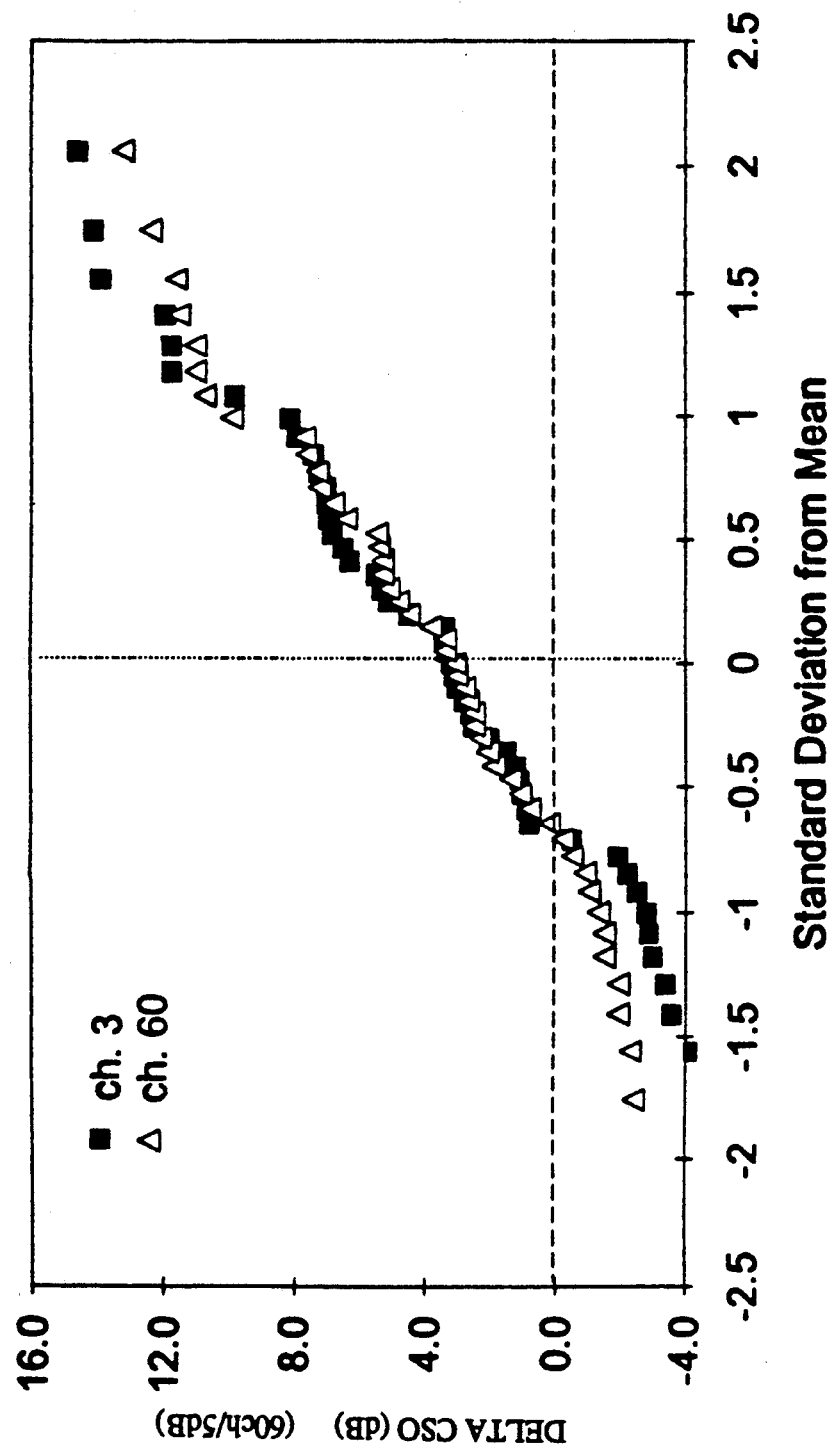
FIG. 2 shows exemplary data that demonstrates the performance improvement that is obtainable through practice of the invention.

FIG. 2 shows a normal probability plot for decrease in CSO distortion (positive delta CSO represents increased linearity) for 60 channel analog testing through 5 dB of conventional single mode fiber, with a carrier level-to-noise ratio of 52 dB. The lasers according to the invention typically had about 4 db lower mean CSO distortion than the prior art lasers, with FIG. 2 showing the results for the two channels (3 and 60) that typically exhibit worst distortion performance. These results translate into an approximately two-fold yield increase in the manufacture of analog DFB lasers.

Figure 3:
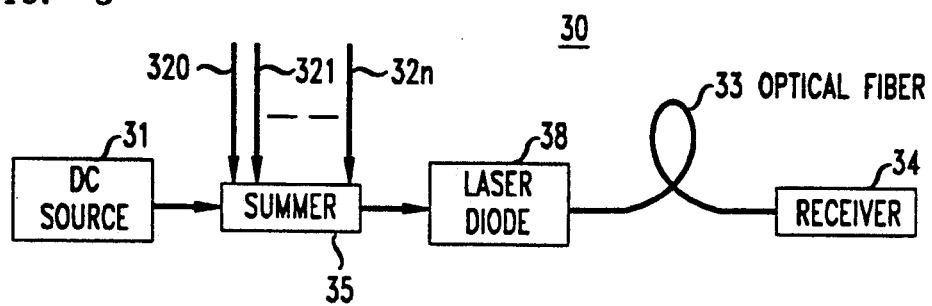
FIG. 3 is a block diagram of an exemplary system according to the invention, namely, a multi-channel sub-carrier multiplexed amplitude modulated optical communication system that comprises a DFB laser according to the invention.

FIG. 3 schematically depicts an exemplary amplitude modulated-vestigial sideband signal sub-channel mutiplexed optical transmission system 30. Several baseband frequency modulation television channel signals 320, 321, . . . 32n are frequency division multiplexed on different carrier frequencies $\omega_0, \omega_1, \omega_2 \ldots \omega_n$, (with n typically substantially greater than 10, e.g., about 60) as separate amplitude modulated-vestigial sideband signal sub-channels in a composite multiplex signal. A summer 35 combines the individual channel signals at the different sub-channel frequencies and a dc bias current $I_{op}$ from the dc source 31 into the composite multiplex signal. This composite multiplex signal is applied to inventive laser diode 38 as the laser drive input signal.

The total laser input drive signal, or injection current, to the laser diode 38 includes both the dc bias component $I_{op}$ and the composite multiplex signal from the summer 35. The channels typically are equally spaced in frequency, with the frequency width of each channel typically being in the range from 10–550 MHz, the bandwidth typically depending, inter alia, on the nature of the signal that is to be transmitted. The output of the laser generally is in the visible or near infrared portion of the spectrum, exemplarily in the approximate range 0.8–1.6 $\mu$m. Currently preferred are wavelengths of about 1.3 and 1.55 $\mu$m, corresponding to the transmission "windows" of currently available $SiO_2$-based optical fibers. The output radiation is coupled into optical fiber 33, and transmitted therethrough to receiver 34.

EXAMPLE I

A multiplicity of capped mesa buried heterostructure (CMBH( DFB lasers was produced substantially as described by Zilko et al. (op. cit). The grating depth and device length were chosen to result in KL of about 1.0. A 190 nm thick facets, substantially as described in the '255 patent, resulting in (less than 1% reflectivity) AR coatings. A triple-pair HR coating consisting of interleaved YSZ and Si layers was deposited on the rear facets, starting with a YSZ layer. The thicknesses were 0.175 $\mu$m and 0.085 $\mu$m, respectively, yielding about 95% reflectivity at the lasing wavelength of 1.3 $\mu$m. The HR coating was also deposited by electron beam evaporation, substantially as described in the '255 patent.

Conventional electrodes were applied in a conventional manner, and measurements were carried out on the devices. The measurements indicate that the multiplicity of lasers according to the invention contained a higher percentage of lasers adapted for use in a multichannel analog optical fiber communication system than is present in an analogous sample of prior art (relatively low reflectivity HR coating) CMBH DFB lasers.

EXAMPLE II-IV

Lasers are made substantially as described in Example I, except that the HR coatings consist of a single layer pair (0.202 $\mu$m $Al_2O_3$/0.085 $\mu$m Si; 0.3460 $\mu$m $CaF_2$/0.085 $\mu$m Si; 0.240 $\mu$m $Na_3AlF_6$/0.085 $\mu$m Si; respectively). The HR coatings have reflectivies at 1.3 $\mu$m of 80.4%, 84.4% and 85.9%, respectively, and a higher percentage of the lasers are adapted for use in a multichannel analog optical fiber communication system than is the case with analogous prior art lasers.

We claim:

1. An article comprising a semiconductor laser comprising
   a) a semiconductor body forming a radiation cavity defined by means that comprise a front facet and a back facet, associated with each of said facets being a reflectivity at a given wavelength $\lambda$, the front facet comprising an antireflection (AR) coating of relatively low reflectivity and the back facet comprising a high reflectivity (HR) coating of relatively high reflectivity;
   b) a diffraction grating associated with the radiation cavity; and
   c) contact means facilitating flowing an electrical current through the semiconductor body;
   CHARACTERIZED IN THAT
   d) said HR coating comprises at least one pair of layers, said layer pair consisting of a layer of first material and a layer of second material, said layers selected such that said reflectivity at wavelength $\lambda$ associated with the back facet is at least 80%.

2. The article of claim 1, wherein the reflectivity associated with the back facet is at least 90%.

3. The article of claim 1, wherein the HR coating comprises a stack of interleaved layers comprising at least two layer pairs, each layer pair consisting of a layer of first material and a layer of second material.

4. The article of claim 3, wherein the first material is yttria-stabilized zirconia, and the second material is silicon.

5. The article of claim 1, wherein the first material is selected to have a refractive index at $\lambda$ that is smaller than that of yttria-stablized zirconia.

6. The article of claim 5, wherein the first material is selected from the group consisting of $Al_2O_3$, $CaF_2$ and $Na_3AlF_6$.

7. Multichannel analog optical fiber communication system comprising transmitting means, receiving means, and a length of optical fiber signal-transmissively connecting the transmitting means and the receiving means, the transmitting means comprising at least one laser that comprises
   a) a semiconductor body forming a radiation cavity defined by a front facet and a back facet, associated with each of said facets being a reflectivity at an operating wavelength $\lambda$, the front facet comprising an antireflection (AR) coating of relatively low reflectivity, and the back facet comprising a high reflectivity (HR) coating of relatively high reflectivity;
   b) a diffraction grating associated with the radiation cavity; and
   c) contact means facilitating flowing an electrical current through the semiconductor body;
   CHARACTERIZED IN THAT
   d) said HR coating comprises at least one pair of layers, said layer pair consisting of a layer of first material and a layer of second material, said layers selected such that the reflectivity at wavelength $\lambda$ that is associated with the back facet is at least 80%.

8. The communication system of claim 7, wherein the reflectivity associated with the back facet is at least 90%.

* * * * *